(12) United States Patent
Ichihara

(10) Patent No.: US 7,206,360 B2
(45) Date of Patent: Apr. 17, 2007

(54) AMPLITUDE DEVIATION CORRECTION CIRCUIT

(75) Inventor: Masaki Ichihara, Tokyo (JP)

(73) Assignee: NEC Corporation, Tokyo (JP)

( * ) Notice: Subject to any disclaimer, the term of this patent is extended or adjusted under 35 U.S.C. 154(b) by 741 days.

(21) Appl. No.: 09/796,467

(22) Filed: Mar. 2, 2001

(65) Prior Publication Data

US 2001/0022821 A1  Sep. 20, 2001

(30) Foreign Application Priority Data

Mar. 15, 2000 (JP) ............................. 2000-072044

(51) Int. Cl.
*H04L 25/06* (2006.01)

(52) U.S. Cl. ...................... 375/317; 375/345

(58) Field of Classification Search ................ 375/317, 375/318, 322, 326, 345, 346; 455/277.2, 455/284, 296, 305, 232.1, 234.1, 234.2, 245.1, 455/250.1; 327/237–238, 240–241, 243, 327/246

See application file for complete search history.

(56) References Cited

U.S. PATENT DOCUMENTS

| | | | |
|---|---|---|---|
| 5,263,196 A | | 11/1993 | Jasper |
| 5,949,821 A | * | 9/1999 | Emami et al. ............... 375/235 |
| 6,009,317 A | * | 12/1999 | Wynn .......................... 455/296 |
| 6,118,322 A | * | 9/2000 | Bockelman et al. ......... 327/317 |
| 6,208,698 B1 | * | 3/2001 | Marchesani et al. ......... 375/298 |
| 6,377,620 B1 | * | 4/2002 | Ozluturk et al. ............ 375/235 |
| 6,484,042 B1 | * | 11/2002 | Loke ........................ 455/550.1 |
| 6,490,326 B1 | * | 12/2002 | Bastani et al. ............... 375/317 |

FOREIGN PATENT DOCUMENTS

| | | |
|---|---|---|
| JP | 5-11521 | 2/1993 |
| JP | 07-094981 | 7/1995 |
| JP | 8-331192 | 12/1996 |
| JP | 09-266498 | 10/1997 |
| JP | 10-022859 | 1/1998 |
| JP | 10-341267 | 12/1998 |

* cited by examiner

*Primary Examiner*—Khanh Tran
(74) *Attorney, Agent, or Firm*—Whitham Curtis Christofferson & Cook, PC

(57) ABSTRACT

A novel amplitude deviation correction circuit which corrects an amplitude deviation between an I signal and a Q signal is disclosed. An average amplitude deviation between an I signal amplified by a variable gain amplifier and a Q signal amplified by another variable gain amplifier is detected by an amplitude comparison circuit, and +1 volt or −1 volt is outputted in response to a result of the detection. An integration circuit integrates the output of the amplitude comparison circuit and controls the gains of the variable gain amplifiers in response to a result of the integration.

19 Claims, 6 Drawing Sheets

AMPLITUDE DEVIATION CORRECTION CIRCUIT

BACKGROUND OF THE INVENTION

1. Field of the Invention

The present invention relates to an amplitude deviation correction circuit, and more particularly to an amplitude deviation correction circuit which corrects an amplitude deviation between two baseband signals of an I signal and a Q signal after orthogonal demodulation in a receiver for an orthogonal phase modulation signal which employs a direct conversion system.

2. Description of the Related Art

Conventionally, orthogonal phase modulation is used for a digital portable telephone receiver (PDC (Personal Digital Cellular system), a PHS (Personal Handy phone System) receiver and a CDMA (Code Division Multiple Access) receiver. In the receivers mentioned, a heterodyne system is used most popularly wherein a received radio frequency signal is converted into an intermediate frequency signal and then two baseband signals are produced by an orthogonal demodulator, whereafter decoding is performed for the baseband signals by a baseband processing section in the following stage.

FIG. 5 shows an example of a conventional receiver of the heterodyne system. Referring to FIG. 5, the conventional receiver of the heterodyne system includes an antenna 1, a radio frequency band-pass filter (RF BPF) 2, a low noise amplifier (LNA) 3, an image filter (IM BPF) 41, a first mixer (MIXER) 42, an IF (intermediate frequency) filter (IF BPF) 43, a first local oscillator 25, an AGC (automatic gain control) circuit 7c, an orthogonal demodulator 4, and a pair of baseband filters (BB BPF) 5 and 6.

The AGC circuit 7c includes variable gain amplifiers (VGA) 8 to 11 and a gain controlling voltage generation circuit 16. The orthogonal demodulator 4 includes an amplifier 31, a pair of double-balanced mixers 32 and 33, and a 90° phase branching unit (0/90) 34.

In operation, a radio frequency signal received by the antenna 1 is band-limited by the radio frequency band-pass filter 2 so that a signal of a reception band is extracted. The band-limited signal is amplified by the low noise amplifier 3 and then passes through the image filter 41 which removes an image frequency of the first mixer 42. An output of the image filter 41 is mixed with a first local signal produced by the first local oscillator 25 by the first mixer 42 so that it is converted into a signal of an intermediate frequency. The intermediate frequency signal (IF signal) is band-limited by the IF filter 43 so that adjacent channel components are suppressed.

An output of the IF filter 43 is amplified by the AGC circuit 7c so that the average amplitude thereof may be fixed. Description of a circuit and an algorithm for controlling the gain of the AGC circuit 7c is omitted herein because they do not have a direct relationship to the present invention. The dynamic range of the AGC circuit 7c reaches several tens dB (approximately 80 dB with a CDMA receiver). The IF signal having the controlled amplitude is orthogonally demodulated into two baseband signals of an I signal and a Q signal with a signal from a second local oscillator 44 by the orthogonal demodulator 4. The I signal and the Q signal are outputted as signals 23 and 24 after they are band-limited by the baseband filters 5 and 6, respectively.

A receiver of the heterodyne system used most popularly at present has such a construction and operates in such a manner as described above. The receiver of the heterodyne system having the construction described above has a problem in that it is difficult to use a large scale integrated circuit to form the receiver and thus difficult to miniaturize the circuit and reduce the number of parts in the future. For example, the image filter 41 is required in the preceding stage to the first mixer 42. Also the IF filter 43 is required for processing in the intermediate frequency band. In the present stage, the elements mentioned are each formed from a passive element such as a SAW (surface acoustic wave) element or a dielectric filter and cannot be incorporated readily into an IC. Further, a second local signal is required by the orthogonal demodulator 4, and the second local oscillator 44 is required to generate the second local signal.

In the future, it is estimated to be requested to form also a high frequency circuit as a large scale integrated circuit and significantly reduce the scale of an apparatus, and therefore, the currently employed construction must be reviewed. One of possible solutions resides in a direct conversion system. A construction of a receiver of the direct conversion system is shown in FIG. 6.

Referring to FIG. 6, the receiver of the direct conversion system includes an antenna 1, a radio frequency band-pass filter 2, a low noise amplifier 3, an orthogonal demodulator 4, a pair of baseband filters 5 and 6, and an AGC circuit 7a. The orthogonal demodulator 4 includes an amplifier 31, a pair of double-balanced mixers 32 and 33, and a 90° phase branching unit 34. The AGC circuit 7a includes variable gain amplifiers 8 to 15 and a gain controlling voltage generation circuit 16.

In operation, a radio frequency signal received by the antenna 1 is band-limited by the radio frequency band-pass filter 2 so that a signal of a reception band is extracted. The band-limited signal is amplified by the low noise amplifier 3 and inputted as it is to the orthogonal demodulator 4. While the orthogonal demodulator 4 is driven with a local signal produced by the local oscillator 25, the local signal has a frequency equal to the central frequency of the radio frequency signal to be received. Baseband signals are produced directly from the radio frequency signal by the orthogonal demodulator 4.

According to the construction of the receiver of the direct conversion system described above, since no image frequency is involved, the image filter 41 is unnecessary. The baseband signals are two I and Q signals and are amplified by the AGC circuit 7a so that the average amplitudes thereof may be fixed after they are band-limited by the baseband filters 5 and 6, respectively. Since a circuit and an algorithm for controlling the gains of the baseband filters 5 and 6 do not have a direct relationship to the present invention, description of them is omitted herein. The dynamic range of the AGC circuit 7a reaches several tens dB (approximately 80 dB with the CDMA). Outputs of the AGC circuit 7a are outputted as signals 23 and 24 to the following stage.

In the receiver of the direct conversion system, channel filters for suppressing adjacent channels are implemented not from SAW filters of the IF band but from the baseband filters 5 and 6. Since the elements can be implemented with a circuit which employs an active element, they are suitable for formation into an IC. Further, since a radio frequency signal is converted directly into a baseband signal, the second local oscillator 44 is unnecessary. Furthermore, also the image filter 41 is unnecessary as described hereinabove. Therefore, there is the possibility that all elements of the reception circuit from the low noise amplifier to the baseband output can be formed into a single chip. This contributes very much to miniaturization and reduction in number of parts of a portable telephone set.

However, the receiver of the direct conversion system has the following problem. While, according to the conventional construction of the receiver of the heterodyne system, an AGC circuit may be provided at only one place for an IF signal, according to the receiver of the direct conversion system, it is necessary to provide AGC circuits separately for an I signal and a Q signal of the baseband.

As shown in FIG. 6, on the I signal side, an AGC circuit is formed from the variable gain amplifiers 8, 9, 10 and 11, and on the Q signal side, another AGC circuit is formed from the variable gain amplifiers 12, 13, 14 and 15. Where different variable gain amplifiers are provided for the I signal and the Q signal in this manner, even if the gains are controlled with the same gain controlling signal 22, a deviation in gain still occurs. For example, if total gain errors of the variable gain amplifier 8, 9, 10 and 11 and the variable gain amplifiers 12, 13, 14 and 15 are individually ±3 dB, then an amplitude deviation of ±6 dB in the maximum appears between the I signal and the Q signal. This corresponds to just twice or one half and makes a cause of quality deterioration at a decoding circuit in the following stage.

Meanwhile, an example of an amplitude deviation correction circuit of the type described is disclosed in Japanese Patent Laid-Open No. 94981/1995 (hereinafter referred to as document 1) and Japanese Patent Laid-Open No. 266498/1997 (hereinafter referred to as document 2). According to the technique disclosed in the document 1, the levels of an I signal and a Q signal are compared with a preset level, and the gain variation rates of amplifiers for amplifying the I signal and the Q signal are varied in response to the deviations. According to the technique disclosed in the document 2, the difference in amplification degree between two amplifiers for amplifying an I signal and a Q signal is minimized based on an integration value of the difference in output voltage between the I signal and the Q signal. A different example is disclosed also in Japanese Patent Laid-Open No. 22859/1998 (hereinafter referred to as document 3).

SUMMARY OF THE INVENTION

It is an object of the present invention to provide an amplitude deviation correction circuit of a novel construction which can correct an amplitude deviation between an I signal and a Q signal.

In order to attain the object described above, according to an aspect of the present invention, there is provided an amplitude deviation correction circuit, comprising first amplification means for amplifying a first signal, second amplification means for amplifying a second signal, amplitude deviation detection means for comparing amplitudes of the first and second signals amplified by the first and second amplification means with each other to detect an average amplitude deviation between the first and the second signals, and integration means for integrating an output of the amplitude deviation detection means and controlling gains of the first and second amplification means based a result of the integration.

According to another aspect of the present invention, there is provided an amplitude deviation correction circuit, comprising first amplification means for amplifying a first signal, second amplification means for amplifying a second signal, gain control means for controlling gains of the first and second amplification means with a control signal common to the first and second amplification means, amplitude deviation detection means for comparing amplitudes of the first and second signals amplified by the first and second amplification means with each other to detect an average amplitude deviation between the first and the second signals, and integration means for integrating an output of the amplitude deviation detection means and controlling the gains of the first and second amplification means based on a result of the integration.

With the amplitude deviation correction circuits, the average amplitude deviation between the first and second signals is detected and the output of the average amplitude deviation is integrated and then the gains of the first and second amplification means are controlled based on a result of the integration. Consequently, the amplitude deviation between the first and second signals such as an I signal and a Q signal of a baseband obtained by orthogonal demodulation can be corrected.

More particularly, with the amplitude deviation correction circuits, it is possible to detect an average amplitude deviation between two baseband signals received such as an I signal and a Q signal as mentioned above and operate respective variable gain amplifiers in response to a result of the detection to perform automatic adjustment so that the gain deviation may be eliminated. Particularly in a receiver of the direct conversion system, a variable gain amplifier of a large dynamic range in the baseband is used for both of the I signal and the Q signal of baseband outputs. While the gains of the variable gain amplifiers are usually controlled with a common gain control signal, a deviation still appears between the gains due to a dispersion of parts. This deviation has a bad influence on a decoding circuit in the following stage of the receiver. Where the amplitude deviation correction circuits are applied, the deviation can be eliminated automatically. Therefore, otherwise possible deterioration of the reception quality of the decoding circuit in the following stage of the receiver can be prevented.

The above and other objects, features and advantages of the present invention will become apparent from the following description and the appended claims, taken in conjunction with the accompanying drawings in which like parts or elements are denoted by like reference symbols.

DESCRIPTION OF THE PREFERRED EMBODIMENT

Figure 1:
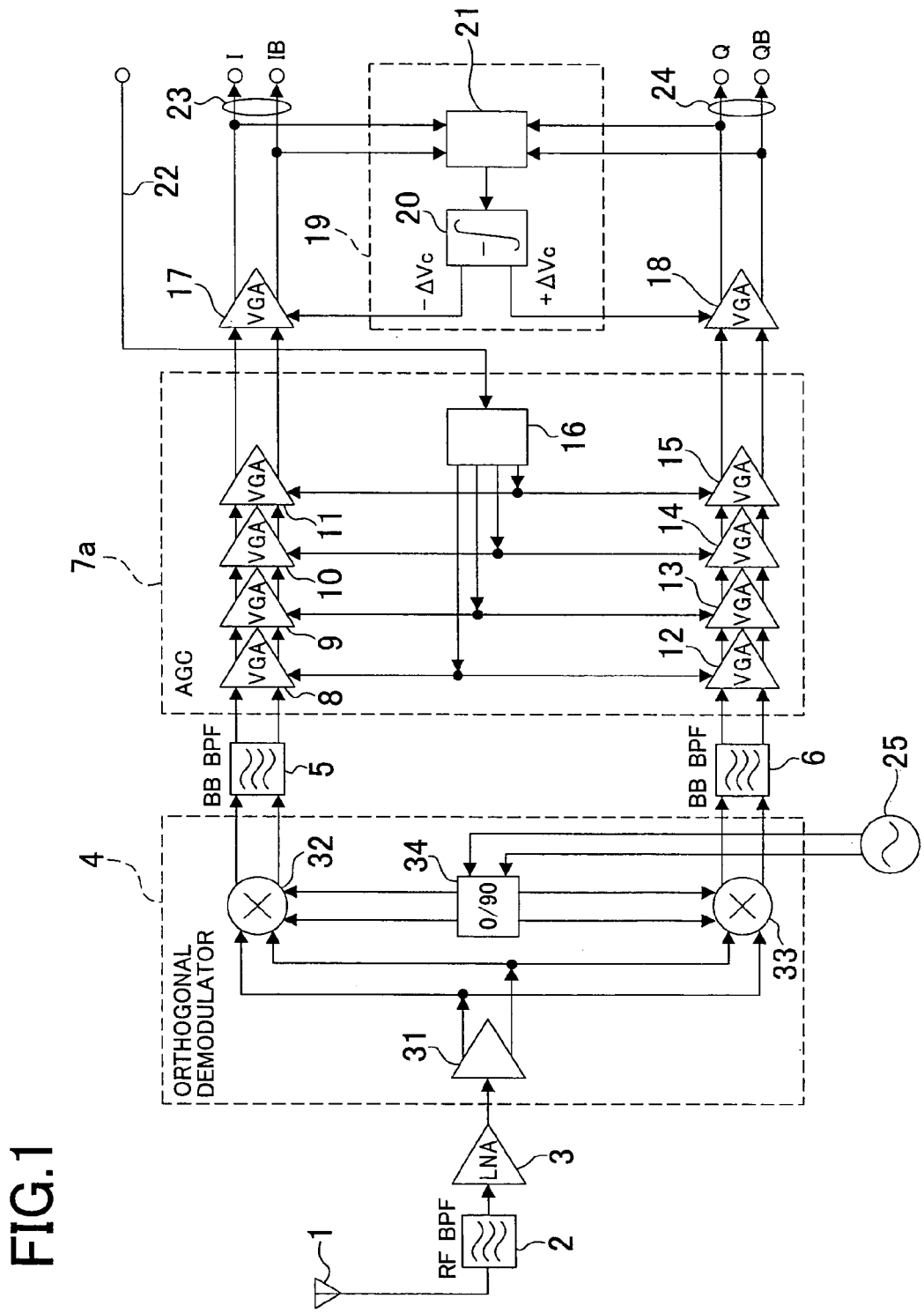
FIG. 1 is a block diagram of an amplitude deviation correction circuit to which the present invention is applied.
Figure 6:
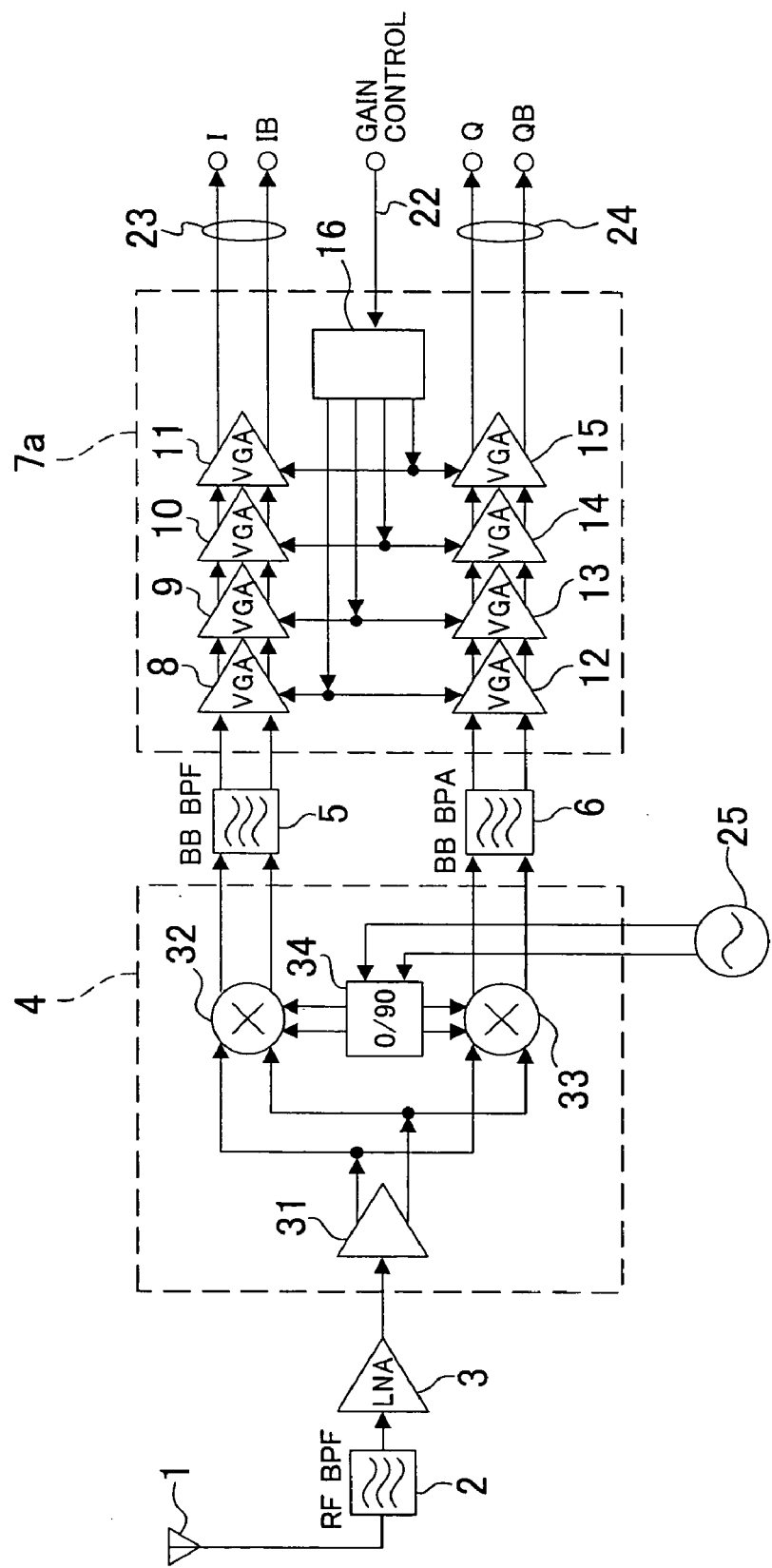
FIG. 6 is a block diagram showing a receiver of the direct conversion system.

Referring to FIG. 1, there is shown an amplitude deviation correction circuit to which the present invention is applied. The amplitude deviation correction circuit is incorporated in a receiver of the direct conversion system which includes an antenna 1, a radio frequency band-pass filter 2, a low noise amplifier 3, an orthogonal demodulator 4 which includes an amplifier 31, a pair of double-balanced mixers 32 and 33, and a 90° phase branching unit 34, a pair of baseband filters 5 and 6, and an AGC circuit 7a which includes variable gain amplifiers 8 to 15 and a gain controlling voltage generation circuit 16. The elements of the receiver mentioned are all similar to those of the receiver of the direct conversion system described hereinabove with reference to FIG. 6, and therefore, overlapping description is omitted herein to avoid redundancy. The amplitude deviation correction circuit according to the present invention is positioned following the AGC circuit 7a.

The amplitude deviation correction circuit in the following stage of the AGC circuit 7a includes a pair of variable gain amplifiers 17 and 18, and an amplitude correction circuit 19. The amplitude correction circuit 19 includes an integration circuit 20 and an amplitude comparison circuit 21.

In operation, an I signal (in-phase component or first signal) and a Q signal (orthogonal component or second signal) outputted from the AGC circuit 7a pass through the variable gain amplifiers 17 and 18 and are outputted as signals 23 and 24 to the following stage, respectively. The output of the variable gain amplifier 17, that is, the I signal, is branched and inputted to the amplitude comparison circuit 21. Similarly, also the output of the variable gain amplifier 18, that is, the Q signal, is branched and inputted to the amplitude comparison circuit 21.

The amplitude comparison circuit 21 compares the amplitudes of the I signal and the Q signal inputted thereto with each other and, for example, outputs +1 volt when $|I|>|Q|$, that is, when the amplitude of the I signal is greater than that of the Q signal, but outputs −1 volt conversely when $|I|<|Q|$, that is, when the amplitude of the I signal is smaller than that of the Q signal. The integration circuit 20 reversely integrates (smoothes) an output of the amplitude comparison circuit 21 with a sufficient time constant. The gain of the variable gain amplifier 17 is controlled using a voltage output $-\Delta Vc$ of a result of the reversal integration. Meanwhile, the integration circuit 20 outputs also a voltage output $+\Delta Vc$ further reversed from the voltage output $-\Delta Vc$ of the reverse integration, and the gain of the variable gain amplifier 18 is controlled with the signal of the voltage output $+\Delta Vc$.

Figure 4:
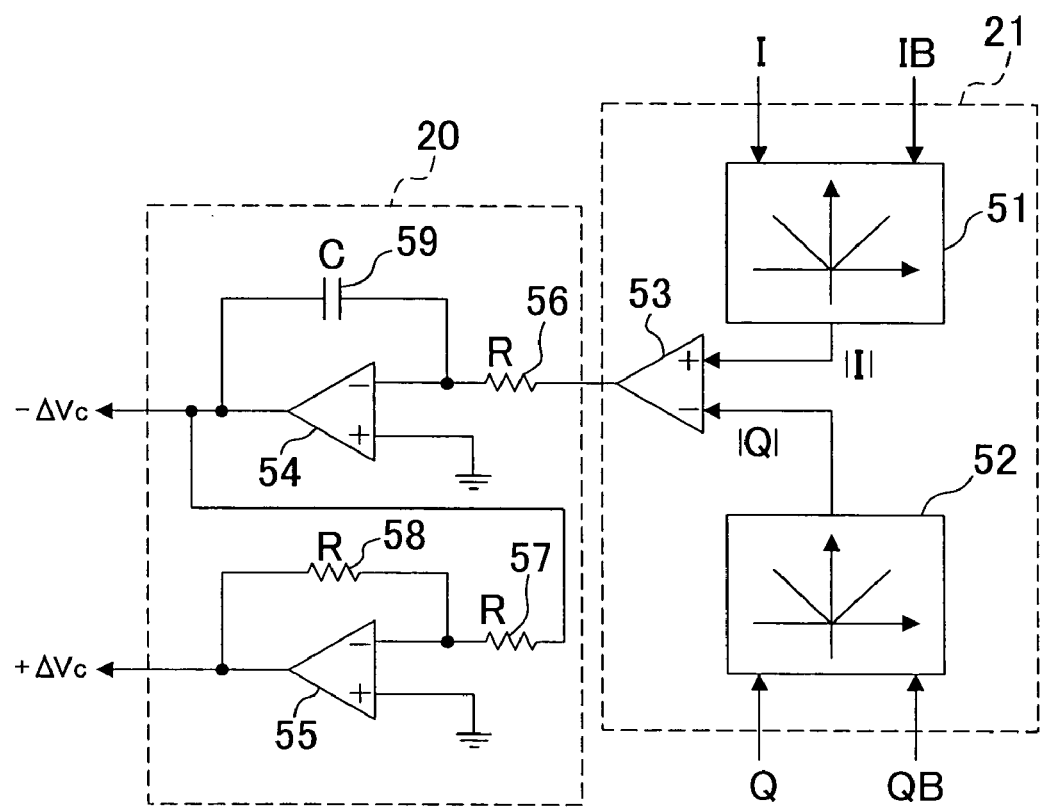
FIG. 4 is a block diagram showing an amplitude comparison circuit and an integration circuit shown in FIGS. 1 and 2.
Figure 5:
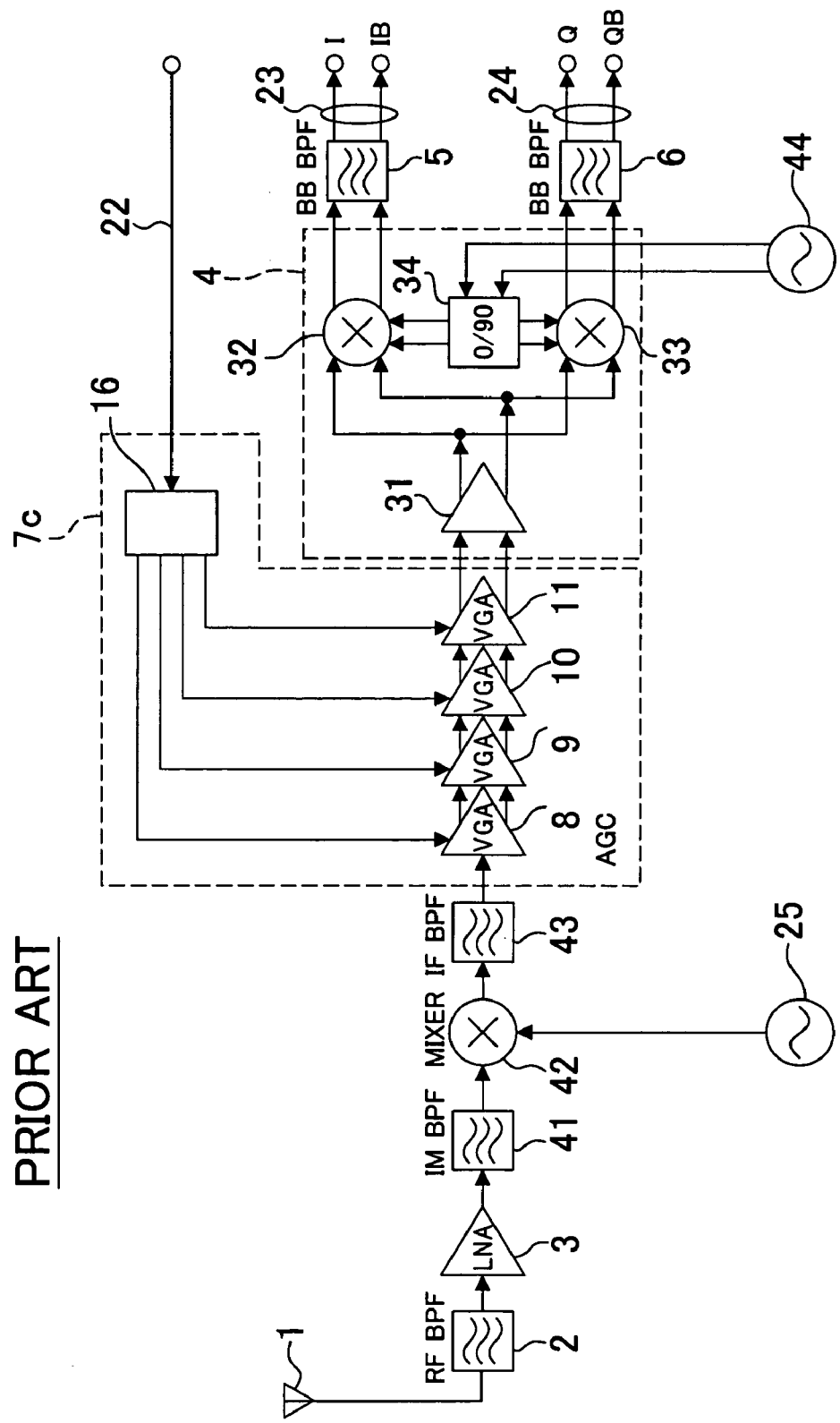
FIG. 5 is a block diagram showing an example of a conventional receiver of the heterodyne system.

Referring now to FIG. 4, there is shown an example of a construction of the amplitude comparison circuit 21 and the integration circuit 20 described above. The amplitude comparison circuit 21 includes a pair of rectifier circuits 51 and 52 and a comparator 53. The integration circuit 20 includes a pair of operational amplifiers 54 and 55, resistors 56 to 58, and a capacitor 59.

Subsequently, operation of the amplitude comparison circuit 21 and the integration circuit 20 is described. The rectifier circuits 51 and 52 produce absolute values $|I|$ and $|Q|$ of the amplitudes of the I signal and the Q signal. The values are compared with each other by the comparator 53. An output of the comparator 53 may be set, for example, to ±1 volt. The output of the comparator 53 is passed through a reverse integrator formed from the resistor 56, capacitor 59 and operational amplifier 54 to obtain a voltage output $-\Delta Vc$. Further, the output $-\Delta Vc$ of the reverse integrator is passed through a reverse amplifier formed from the resistors 57 and 58 and the operational amplifier 55 to obtain a voltage output $\Delta Vc$.

Figure 3:
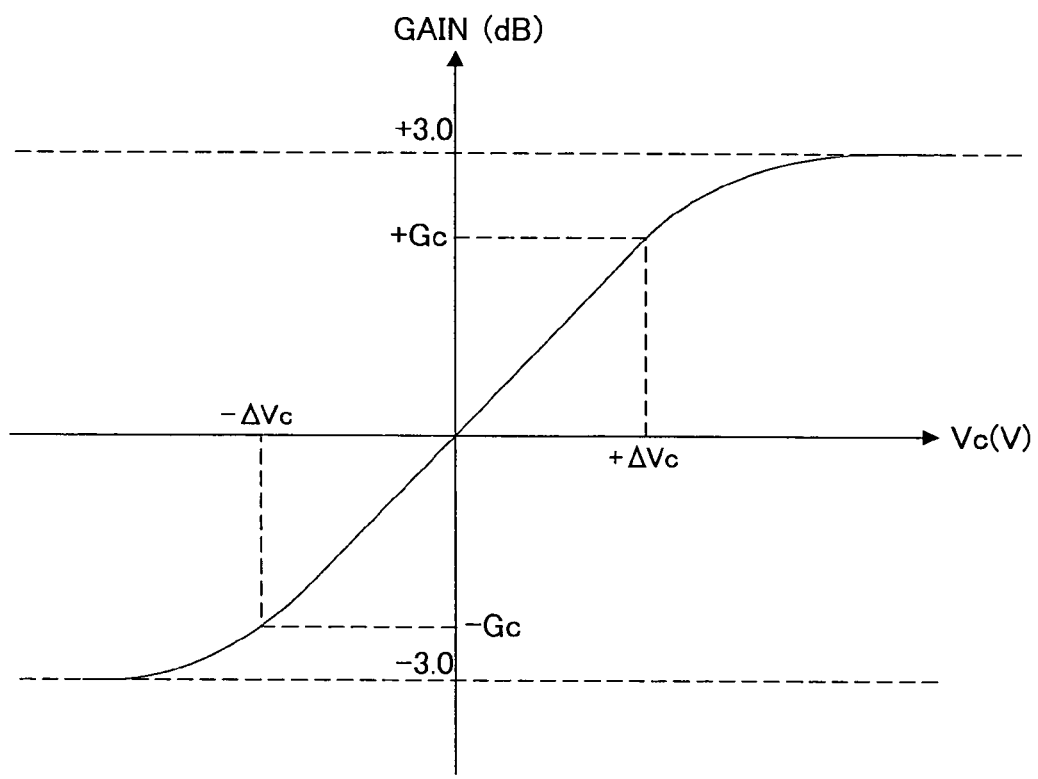
FIG. 3 is a gain control signal to gain characteristic diagram of variable gain amplifiers shown in FIG. 1.

Subsequently, operation of the amplitude deviation correction circuit is described in detail. An example of a gain control signal to gain characteristic of the variable gain amplifiers 17 and 18 is shown in FIG. 3. As can be seen from FIG. 3, such a symmetry that, when the gain control signal Vc is $+\Delta Vc$, the gain is $+Gc$, but when the gain control signal Vc is $-\Delta Vc$, the gain is $-Gc$ is preferable. Further, where the range of variation of the gain is ±3 dB, the amplitude deviation of up to ±6 dB between the I signal and the Q signal can be corrected by the amplitude deviation correction circuit.

Since the I signal and the Q signal inputted to the amplitude comparison circuit 21 are both in a modulated state, they have random (random) instantaneous values. However, on an average, one of them has a higher value, and the time rate at which the output of the amplitude comparison circuit 21 becomes +1 volt varies in conformity with the ratio in magnitude. In particular, if $|I|>|Q|$ on an average, then the rate at which the output of the amplitude comparison circuit 21 is +1 volt is high, but in the reverse case, the rate at which the output of the amplitude comparison circuit 21 becomes −1 volt is high. If the output of the amplitude comparison circuit 21 is reversely integrated and integrated to control the variable gain amplifiers 17 and 18 in such a manner as seen in FIG. 3, then if $|I|>|Q|$ on an average, then the integration circuit 20 operates so that the gain of the I signal drops and the gain of the Q signal rises. On the contrary if $|I|<|Q|$ on an average, then the integration circuit 20 operates so that the gain of the I signal rises and the gain of the Q signal drops. The amplitude deviation between the I signal and the Q signal is corrected thereby.

Particularly as an example of operation, when amplitude comparison is performed by the amplitude comparison circuit 21, if the I signal is higher than the Q signal, then the output of the integration circuit 20 varies so that the gain of the variable gain amplifier 17 may be dropped or the gain of the variable gain amplifier 18 may be raised, but if the I signal is lower than the Q signal, then the output of the integration circuit 20 varies so that the gain of the variable gain amplifier 17 may be raised or the gain of the variable gain amplifier 18 may be dropped.

As another example of operation, when amplitude comparison is performed by the amplitude comparison circuit 21, if the I signal is higher than the Q signal, then the output of the integration circuit 20 varies so that the gain of the variable gain amplifier 17 may be dropped and the gain of the variable gain amplifier 18 may be raised, but if the I signal is lower than the Q signal, then the output of the integration circuit 20 varies so that the gain of the variable gain amplifier 17 may be raised and the gain of the variable gain amplifier 18 may be dropped.

Subsequently, another amplitude deviation correction circuit to which the present invention is applied is described. While the amplitude deviation correction circuit of the second embodiment has a basic construction similar to that of the first embodiment described above, according to the second embodiment, the variable gain amplifiers 17 and 18 can be omitted.

Figure 2:
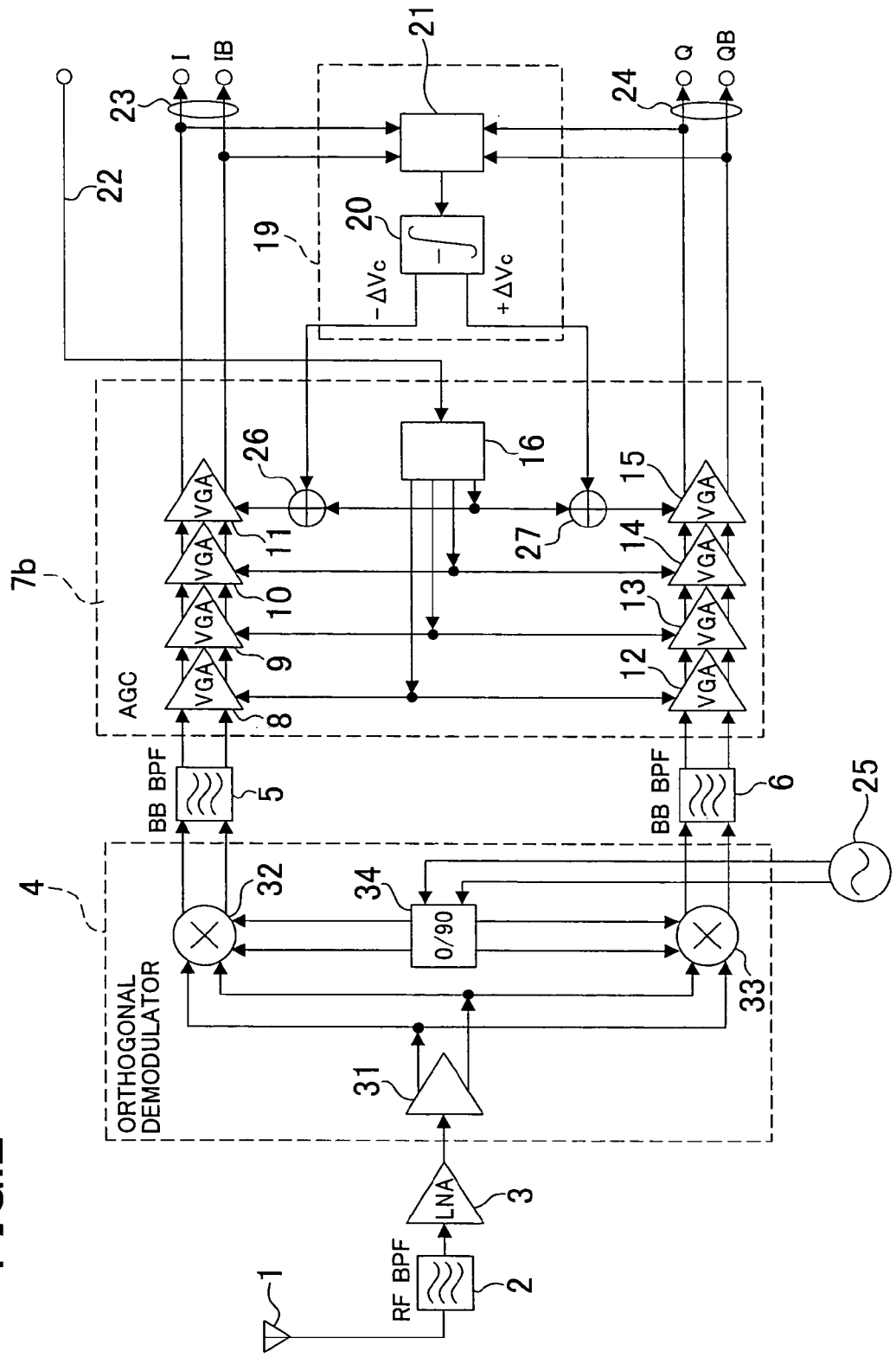
FIG. 2 is a similar view but showing another amplitude deviation correction circuit to which the present invention is applied.

The amplitude deviation correction circuit of the second embodiment is shown in FIG. 2. Referring to FIG. 2, the amplitude deviation correction circuit of the second embodiment is different from the amplitude deviation correction circuit of the first embodiment in that it does not include the variable gain amplifiers 17 and 18 which are components of the amplitude deviation correction circuit of the first embodiment but instead uses the amplifiers 11 and 15, which are a set of variable gain amplifiers of the I signal side and the Q signal side of the AGC circuit 7b, as such, respectively.

In particular, as gain control signals for the variable gain amplifiers 11 and 15, the outputs $-\Delta Vc$ and $\Delta Vc$ of the integration circuit 20 are applied through a pair of addition circuits 26 and 27. Consequently, the balance between the gains of the variable gain amplifiers 11 and 15 which output the signals 23 and 24 to the following stage is varied to correct the amplitude deviation between the I signal and the Q signal. Consequently, similar effects to those of the amplitude deviation correction apparatus of FIG. 1 are achieved.

While preferred embodiments of the present invention have been described using specific terms, such description is for illustrative purposes only, and it is to be understood that changes and variations may be made without departing from the spirit or scope of the following claims.

What is claimed is:

1. An amplitude deviation correction circuit, comprising:
   first amplification means for amplifying a first signal;
   second amplification means for amplifying a second signal;
   amplitude deviation detection means for comparing instantaneous absolute values of amplitudes of the first and second signals amplified by said first and second amplification means with each other to detect an amplitude deviation between said instantaneous absolute values of the first and the second signals amplified by said first and second amplification means; and
   integration means for integrating a time rate of an output of said amplitude deviation detection means representing an amplitude deviation between said instantaneous absolute values of the first and the second signals and controlling gains of said first and second amplification means based a result of the integration.

2. An amplitude deviation correction circuit as claimed in claim 1, further comprising third amplification means for amplifying the first signal, fourth amplification means for amplifying the second signal, and gain control means for controlling gains of said third and fourth amplification means with a control signal common to said third and fourth amplification means.

3. An amplitude deviation correction circuit as claimed in claim 2, wherein, if a result of the amplitude comparison performed by said amplitude deviation detection means proves that the first signal is higher than the second signal, then an output of said integration means varies so that the gain of said first amplification means is dropped and the gain of said second amplification means is raised, but if the result of the amplitude comparison proves that the first signal is lower than the second signal, then the output of said integration means varies so that the gain of said first amplification means is raised and the gain of said second amplification means is dropped.

4. An amplitude deviation correction circuit as claimed in claim 1, wherein, if a result of the amplitude comparison performed by said amplitude deviation detection means proves that the first signal is higher than the second signal, then an output of said integration means varies so that the gain of said first amplification means is dropped or the gain of said second amplification means is raised, but if the result of the amplitude comparison proves that the first signal is lower than the second signal, then the output of said integration means varies so that the gain of said first amplification means is raised or the gain of said second amplification means is dropped.

5. An amplitude deviation correction circuit as claimed in claim 1, wherein said amplitude deviation detection means includes first and second absolute value production means for producing absolute values of the amplitudes of the first and second signals amplified by said first and second amplification means, and differential amplification means for differentially amplifying outputs of said first and second absolute value production means.

6. An amplitude deviation correction circuit as claimed in claim 1, wherein said integration means includes reverse integration means for reversely integrating the output of said amplitude deviation detection means, and reversal means for reversing an output of said reverse integration means.

7. An amplitude deviation correction circuit as claimed in claim 6, wherein the gain of said first amplification means is controlled with an output of said reverse integration means and the gain of said second amplification means is controlled with an output of said reversal means.

8. An amplitude deviation correction circuit as claimed in claim 1, wherein the first and second signals are orthogonal demodulation signals.

9. An amplitude deviation correction circuit as claimed in claim 1, wherein the first and second signals are signals obtained from a direct conversion receiver.

10. An amplitude deviation correction circuit as recited in claim 1, wherein said amplitude deviation detection means produces an output having a sign corresponding to a sign of a difference between said first signal and said second signal.

11. An amplitude deviation correction circuit as claimed in claim 1, wherein said amplitude deviation detection means produces a signal having an amplitude and a first sign when said absolute value of said first signal is larger than said second signal and having said amplitude and a second sign when said absolute value of said second signal is larger than said second signal.

12. An amplitude deviation correction circuit, comprising:
    first amplification means for amplifying a first signal;
    second amplification means for amplifying a second signal;
    gain control means for controlling gains of said first and second amplification means with a control signal common to said first and second amplification means;
    amplitude deviation detection means for comparing instantaneous absolute values of amplitudes of the first and second signals amplified by said first and second amplification means with each other to detect an amplitude deviation between said instantaneous absolute values of the first and the second signals amplified by said first and second amplification means; and
    integration means for integrating a time rate of an output of said amplitude deviation detection means representing an amplitude deviation between said instantaneous absolute values of the first and the second signals and controlling the gains of said first and second amplification means based on a result of the integration.

13. An amplitude deviation correction circuit as claimed in claim 12, wherein said amplitude deviation detection means includes first and second absolute value production means for producing absolute values of the amplitudes of the first and second signals amplified by said first and second amplification means, and differential amplification means for differentially amplifying outputs of said first and second absolute value production means.

14. An amplitude deviation correction circuit as claimed in claim 12, wherein said integration means includes reverse integration means for reversely integrating the output of said amplitude deviation detection means, and reversal means for reversing an output of said reverse integration means.

15. An amplitude deviation correction circuit as claimed in claim 14, wherein the gain of said first amplification means is controlled with an output of said reverse integration means and the gain of said second amplification means is controlled with an output of said reversal means.

16. An amplitude deviation correction circuit as claimed in claim 12, wherein the first and second signals are orthogonal demodulation signals.

17. An amplitude deviation correction circuit as claimed in claim 12, wherein the first and second signals are signals obtained from a direct conversion receiver.

18. An amplitude deviation correction circuit as recited in claim 12, wherein said amplitude deviation detection means produces an output having a sign corresponding to a sign of a difference between said first signal and said second signal.

19. An amplitude deviation correction circuit as claimed in claim 12, wherein said amplitude deviation detection means produces a signal having an amplitude and a first sign when said absolute value of said first signal is larger than said second signal and having said amplitude and a second sign when said absolute value of said second signal is larger than said second signal.

* * * * *